United States Patent
Hioka

(10) Patent No.: US 11,069,851 B2
(45) Date of Patent: Jul. 20, 2021

(54) SEMICONDUCTOR DEVICE HAVING A VERTICAL HALL ELEMENT WITH A BURIED LAYER

(71) Applicant: ABLIC Inc., Chiba (JP)

(72) Inventor: Takaaki Hioka, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/663,800

(22) Filed: Oct. 25, 2019

(65) Prior Publication Data

US 2020/0152861 A1 May 14, 2020

(30) Foreign Application Priority Data

Nov. 9, 2018 (JP) .............................. JP2018-211558

(51) Int. Cl.
  *H01L 43/06* (2006.01)
  *G01R 33/07* (2006.01)
  *H01L 43/04* (2006.01)

(52) U.S. Cl.
  CPC .......... *H01L 43/065* (2013.01); *G01R 33/077* (2013.01); *H01L 43/04* (2013.01)

(58) Field of Classification Search
  CPC . H01L 43/04; H01L 43/06–065; H01L 43/14; H01L 27/22; G01R 33/077
  See application file for complete search history.

(56) References Cited

U.S. PATENT DOCUMENTS

| 4,929,993 A * | 5/1990 | Popovic ................ H01L 43/065 257/424 |
| 2005/0230770 A1* | 10/2005 | Oohira .................. H01L 43/065 257/421 |
| 2007/0290682 A1* | 12/2007 | Oohira ................. G01R 33/075 324/251 |
| 2009/0295375 A1* | 12/2009 | Oohira .................. G01D 5/145 324/207.21 |
| 2016/0146906 A1* | 5/2016 | Suzuki ................ G01R 33/075 257/424 |
| 2016/0209480 A1* | 7/2016 | Hioka .................. G01R 33/077 |
| 2018/0123023 A1* | 5/2018 | Green ..................... H01L 43/06 |

(Continued)

FOREIGN PATENT DOCUMENTS

| JP | 2005-333103 A | 12/2005 |
| JP | 2018-093083 A | 6/2018 |

*Primary Examiner* — Younes Boulghassoul

(74) *Attorney, Agent, or Firm* — Brinks Gilson & Lione

(57) ABSTRACT

A semiconductor devices has a vertical Hall element formed on a semiconductor substrate, the vertical Hall element including a semiconductor layer of a second conductivity type formed above the semiconductor substrate; an impurity diffusion layer of the second conductivity type formed in an upper portion of the semiconductor layer and having a concentration higher than that of the semiconductor layer; a plurality of electrodes formed on a surface of the impurity diffusion layer, arrayed in a straight line, and each formed from an impurity region of the second conductivity type; a plurality of electrode isolation diffusion layers of the first conductivity type each formed between two adjacent electrodes; and a buried layer formed between the semiconductor substrate and the semiconductor layer, and having a concentration higher than that of the semiconductor layer and lower than that of the impurity diffusion layer.

8 Claims, 3 Drawing Sheets

(56) References Cited

U.S. PATENT DOCUMENTS

2018/0159025 A1* 6/2018 Hioka .................. H01L 43/065
2018/0203078 A1* 7/2018 Hioka .................... H01L 43/04
2018/0315919 A1* 11/2018 Ogawa ................. H01L 43/065

* cited by examiner

SEMICONDUCTOR DEVICE HAVING A VERTICAL HALL ELEMENT WITH A BURIED LAYER

RELATED APPLICATIONS

This application claims priority to Japanese Patent Application Nos. 2018-211558 filed on Nov. 9, 2018, the entire content of which is incorporated herein by reference.

BACKGROUND OF THE INVENTION

1. Field of the Invention

The present invention relates to a semiconductor device, and more particularly, to a semiconductor device having a vertical Hall element which detects a magnetic field in a horizontal direction.

2. Description of the Related Art

In general, enhancement of sensitivity is more difficult in a vertical Hall element than in a horizontal Hall element.

A vertical Hall element is disclosed, for example, in Japanese Patent Application Laid-open No. 2005-333103. There is proposed a configuration in which electrodes each formed from an N-type diffusion layer and an electrode isolation diffusion layer (P well) which isolates adjacent electrodes are arranged in a magnetism sensing portion (N well) formed in a P-type substrate, and the impurity concentration distribution of the magnetism sensing portion has the highest at the front surface of the substrate and decreases gradually as the depth from the front surface increases. In the above-mentioned configuration, the width of a depletion layer which is formed around the electrode isolation diffusion layer and the width of the electrode isolation diffusion layer itself which becomes narrower along the depth from the front surface thereby complement each other so as to keep the flow of current from spreading in the magnetism sensing portion, relatively increasing a current component that flows in a direction perpendicular to the substrate and improving sensitivity.

However, in the configuration of Japanese Patent Application Laid-open No. 2005-333103, a current supplied between two electrodes that sandwich the electrode isolation diffusion layer flows from one of the electrodes on the front surface of the substrate in a direction toward the rear surface of the substrate (downward), then flows in a direction parallel to the substrate in a part below the electrode isolation diffusion layer, and, from there, flows to the other of the two electrodes on the front surface of the substrate (upward).

The current flowing in the direction parallel to the substrate in the part below the electrode isolation diffusion layer concentrates particularly on a region that is immediately below the electrode isolation diffusion layer and that has the lowest resistance (highest concentration) throughout the part of the magnetism sensing portion that is located below the electrode isolation diffusion layer. Since the resistance of the magnetism sensing portion becomes high toward the rear surface side of the substrate, substantially no current flows in a region close to the rear surface of the substrate in the part of the magnetism sensing portion that is located below the electrode isolation diffusion layer. The width in the depth direction of the substrate of the current flowing in the direction parallel to the substrate consequently becomes narrow.

The magnetic sensitivity of a Hall element is known to increase in proportion to the width of the flow of current. The configuration disclosed in Japanese Patent Application Laid-open No. 2005-333103, in which the flow of current in the direction parallel to the substrate has a narrow width as described above, has a difficulty in satisfactorily improving sensitivity as a result.

The inventor of the present invention has proposed, in Japanese Patent Application Laid-open No. 2018-93083, a vertical Hall element having a configuration in which an N-type semiconductor layer having a uniform concentration distribution is formed on a semiconductor substrate, an N-type impurity diffusion layer having a concentration higher than the concentration of the N-type semiconductor layer is formed on the N-type semiconductor layer, a plurality of electrodes each formed from an N-type impurity region having a concentration higher than the concentration of the N-type impurity diffusion layer is formed in a straight line on a surface of the N-type impurity diffusion layer, and a plurality of P-type electrode isolation diffusion layers each of which is placed between two adjacent electrodes is formed to isolate the plurality of electrodes from one another.

According to the vertical Hall element of Japanese Patent Application Laid-open No. 2018-93083, since the resistance in the N-type semiconductor layer is uniform, the current flowing in a direction parallel to the semiconductor substrate flows throughout the entirety of the N-type semiconductor layer when a current is supplied between predetermined electrodes, permitting increase of the magnetic sensitivity.

However, as a result of further research conducted by the inventor of the present invention, with the configuration of the vertical Hall element proposed in Japanese Patent Application Laid-open No. 2018-93083, it has been found that the current flowing in the direction parallel to the semiconductor substrate does not exhibit a completely uniform flow throughout the entirety of the N-type semiconductor layer. This is because, of the current flowing in the direction parallel to the semiconductor substrate, a path of a current flowing through a portion of the N-type semiconductor layer near the semiconductor substrate, that is, through a deep portion of the N-type semiconductor layer includes additional paths in a direction substantially perpendicular to the semiconductor substrate at a start and an end thereof, and hence the length of the entire current path becomes longer. The resistance of the current path is increased by the length, and hence it becomes harder for the current to flow. Consequently, there is room for further increasing the magnetic sensitivity even though the vertical Hall element according to Japanese Patent Application Laid-open No. 2018-93083 has sufficiently increased magnetic sensitivity as compared to Japanese Patent Application Laid-open No. 2005-333103.

SUMMARY OF THE INVENTION

It is an object of the present invention to provide a semiconductor device having a vertical Hall element with increased sensitivity by means of a current flowing in a direction parallel to a substrate.

A semiconductor device according to an embodiment of the present invention includes a semiconductor substrate of a first conductivity type; and a vertical Hall element formed on the semiconductor substrate, the vertical Hall element including a semiconductor layer of a second conductivity type provided above the semiconductor substrate; an impurity diffusion layer of the second conductivity type formed in an upper portion of the semiconductor layer and having a concentration higher than a concentration of the semiconductor layer; a plurality of electrodes formed on a surface of the impurity diffusion layer, arrayed in a straight line, and each formed from an impurity region of the second conductivity type, the impurity region having a concentration higher than the concentration of the impurity diffusion layer; a plurality of electrode isolation diffusion layers of the first conductivity type each formed between two adjacent electrodes, to isolate the plurality of electrodes from one another; and a buried layer of the second conductivity type formed between the semiconductor substrate and the semiconductor layer, and having a concentration higher than the concentration of the semiconductor layer and lower than the concentration of the impurity diffusion layer.

According to one embodiment of the present invention, by the presence of the buried layer of the second conductivity type formed between the semiconductor substrate and the semiconductor layer of the second conductivity type, the current flows from one electrode to the direction of the rear surface of the semiconductor substrate (downward), then flows in the direction parallel to the substrate throughout the entirety of the semiconductor layer of the second conductivity type and the buried layer of the second conductivity type which serve as magnetism sensing portions and, from there, flows to the other electrode (upward) when a current is supplied between the two electrodes.

That is, since the buried layer of the second conductivity type having a resistance lower than that of the semiconductor layer of the second conductivity type is present below the semiconductor layer of the second conductivity type, the current flows not only through the path in the direction parallel to the semiconductor substrate in the region of an upper portion of the semiconductor layer of the second conductivity type, but also through the path downward from inside the impurity diffusion layer of the second conductivity type and further to the buried layer of the second conductivity type, and then through the buried layer of the second conductivity type. The current flowing in the direction parallel to the semiconductor substrate thereby flows uniformly throughout the entirety of the semiconductor layer of the second conductivity type and the buried layer of the second conductivity type without flowing partly.

Consequently, it is possible to increase the width of the current in the depth direction flowing in the direction parallel to the semiconductor substrate, to thereby enhance the magnetic sensitivity of the Hall element.

DETAILED DESCRIPTION OF THE PREFERRED EMBODIMENTS

Embodiments of the present invention will hereinafter be described in detail with reference to the accompanying drawings.

First Embodiment

Figure 1A:
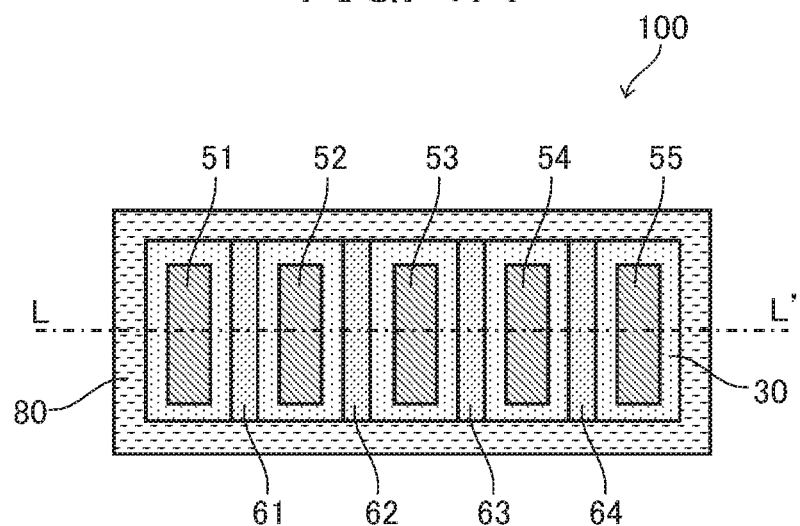
FIG. 1A is a plan view of a semiconductor device with a vertical Hall element according to a first embodiment of the present invention.
Figure 1B:
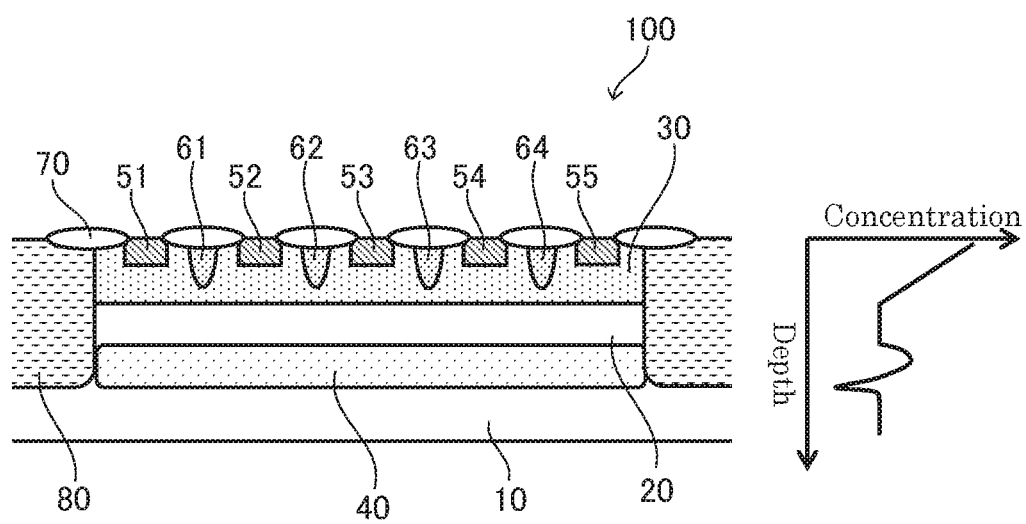
FIG. 1B is a cross-sectional view taken along the line L-L' of FIG. 1A.

FIG. 1A and FIG. 1B are views for illustrating a semiconductor device with a vertical Hall element 100 according to the first embodiment of the present invention. FIG. 1A is a plan view of the semiconductor device, and FIG. 1B is a cross-sectional view taken along the line L-L' of FIG. 1A.

The semiconductor device of the first embodiment includes, as illustrated in FIG. 1A and FIG. 1B, a P-type semiconductor substrate 10, which is a first conductivity type, a vertical Hall element 100 formed on the semiconductor substrate 10, and a P-type element isolation diffusion layer 80 surrounding the perimeter of the vertical Hall element 100.

The vertical Hall element 100 includes an N-type semiconductor layer 20, which is a second conductivity type, formed on the semiconductor substrate 10, an N-type impurity diffusion layer 30 formed on the N-type semiconductor layer 20, electrodes 51 to 55 made from N-type impurity regions, formed in a straight line on a surface of the N-type impurity diffusion layer 30, and serving as drive current supply electrodes and Hall voltage output electrodes, P-type electrode isolation diffusion layers 61 to 64 each formed between two of the electrodes 51 to 55 on the surface of the N-type impurity diffusion layer 30 in order to isolate the electrodes 51 to 55 from one another, and an N-type buried layer 40 formed between the P-type semiconductor substrate 10 and the N-type semiconductor layer 20, and having a concentration higher than that of the N-type semiconductor layer 20 and lower than that of the N-type impurity diffusion layer 30.

The vertical Hall element 100 further includes an insulating film 70, for example, of a $SiO_2$ film, to cover a surface of the N-type impurity diffusion layer 30, except for regions in which the electrodes 51 to 55 are formed. The current flowing parallel to the semiconductor substrate 10 along the surface of the N-type impurity diffusion layer 30 can be suppressed.

The concentration profile of impurities of the P-type semiconductor substrate 10, the N-type buried layer 40, the N-type semiconductor layer 20, and the N-type impurity diffusion layer 30 is illustrated on the right-hand side of FIG. 1B.

As can be seen from the concentration profile, the N-type impurity diffusion layer 30 has a concentration distribution which takes the highest in the vicinity of the surface and decreases as it goes from the surface toward the N-type semiconductor layer 20, the N-type semiconductor layer 20 has a constant impurity concentration distribution, and the N-type buried layer 40 has a concentration distribution which is higher than that of the N-type semiconductor layer 20 and is lower than that of the N-type impurity diffusion layer 30.

The above explained configuration is, for example, formed as follows:

First, N-type impurities are selectively implanted in a region of the semiconductor substrate 10 in which the N-type buried layer 40 is to be formed, then an epitaxial layer for forming the N-type semiconductor layer 20 is formed thereon, and the implanted N-type impurities are diffused to form the N-type buried layer 40 between the semiconductor substrate 10 and the N-type semiconductor layer 20. After the epitaxial layer is formed, N-type impurities are selectively implanted in a region of the epitaxial layer in which the N-type impurity diffusion layer 30 is to be formed, and the implanted N-type impurities are diffused to a predetermined depth to form the N-type impurity diffusion layer 30 on the epitaxial layer. The epitaxial layer which remains under the N-type impurity diffusion layer 30 without diffusion of the N-type impurities forms the N-type semiconductor layer 20.

The N-type semiconductor layer 20 formed in this manner has a constant concentration that is lower than the concentration at the bottom of the N-type impurity diffusion layer 30.

In order to achieve higher magnetic sensitivity, the total thickness of the N-type semiconductor layer 20 and the N-type buried layer 40 which serve as magnetism sensing portions is preferred to be larger, for example, 6 μm or more. Further, the impurity concentration of the N-type semiconductor layer 20 is preferably about $1\times10^{15}$ to $1\times10^{17}$ atoms/cm$^3$. The impurity concentration near the surface of the N-type impurity diffusion layer 30 is preferably about $1\times10^{17}$ to $1\times10^{18}$ atoms/cm$^3$. The depth of the N-type impurity diffusion layer 30 is preferably as shallow as about 3 μm to about 5 μm. Further, the impurity concentration of the N-type buried layer 40 is preferably about $1\times10^{16}$ to $5\times10^{17}$ atoms/cm$^3$.

The P-type electrode isolation diffusion layers 61 to 64 are formed by, for example, selectively diffusing P-type impurities in the N-type impurity diffusion layer 30.

After forming the P-type electrode isolation diffusion layers 61 to 64, the electrodes 51 to 55 are, for example, formed by covering the tops of the formed P-type electrode isolation diffusion layers 61 to 64 with the insulating film (SiO$_2$ film) 70 that is, for example, formed by a LOCOS method, while leaving regions in which the electrodes 51 to 55 are formed later, and then introducing N-type impurities with the insulating film 70 used as a mask. The electrodes 51 to 55 are formed to have a depth equal to or less than the depth of the P-type electrode isolation diffusion layers 61 to 64.

A description will be given next with reference to FIG. 2 to explain the principle of detecting a magnetic component in a direction parallel to the semiconductor substrate 10 in the vertical Hall element 100 of the semiconductor device according to the first embodiment.

Figure 2:
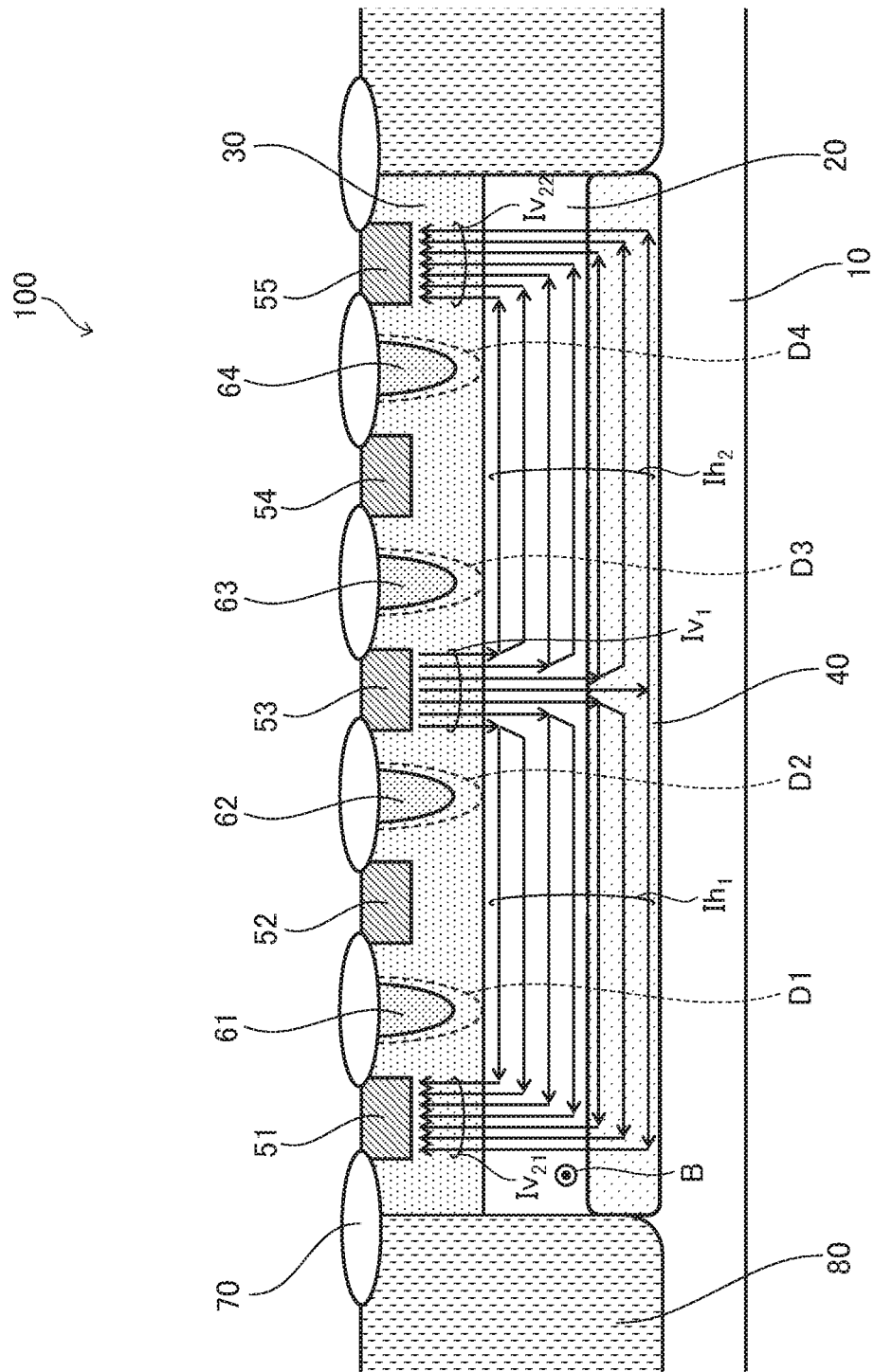
FIG. 2 is an enlarged view of FIG. 1B.

FIG. 2 is an enlarged view of the cross-sectional view of FIG. 1B and is a schematic illustration of a current flow when a drive current is supplied to the electrodes 51, 53, and 55 so that a current flow from the electrode 53 to the electrodes 51 and 55 is generated.

As indicated by B in FIG. 2, a magnetic field is assumed to be applied from the back side of the drawing sheet to the front side, in the direction parallel to the semiconductor substrate 10.

Depletion layers D1 to D4 are formed around the P-type electrode isolation diffusion layers 61 to 64, respectively, as indicated by the broken lines in FIG. 2. The lowermost parts of the depletion layers D1 to D4 are positioned at substantially the same level as the top surface of the N-type semiconductor layer 20.

Specifically, in the vertical Hall element 100 of the first embodiment, the depth and impurity concentration of the P-type electrode isolation diffusion layers 61 to 64 and the depth and impurity concentration of the N-type impurity diffusion layer 30 are selected so that the lowermost parts of the depletion layers D1 to D4 are positioned at substantially the same level as the top surface of the N-type semiconductor layer 20. Even though depletion layers are also formed inside the P-type electrode isolation diffusion layers 61 to 64, these are omitted in FIG. 2.

When a current flow is made from the electrode 53 to the electrodes 51 and 55 in the thus configured vertical Hall element 100, the current first flows from the electrode 53 in a direction perpendicular to the semiconductor substrate 10 as indicated by the arrows $Iv_1$, toward a rear surface of the semiconductor substrate 10 (downward) through the N-type impurity diffusion layer 30, the N-type semiconductor layer 20, and the buried layer 40.

Then, the current flows in directions parallel to the semiconductor substrate 10 (leftward direction and rightward direction) as indicated by the arrows $Ih_1$ and the arrows $Ih_2$. The current flowing in the directions parallel to the semiconductor substrate 10 cannot flow in the N-type impurity diffusion layer 30 due to the presence of the P-type electrode isolation diffusion layers 62 and 63 and the depletion layers D2 and D3 on both sides of the electrodes 53, but flows through the N-type semiconductor layer 20 and the buried layer 40 instead as indicated by the arrows $Ih_1$ and the arrows $Ih_2$.

In the vertical Hall element according to the prior art (Japanese Patent Application Laid-open No. 2018-93083), because the impurity concentration distribution of the N-type semiconductor layer is constant, the resistance in the N-type semiconductor layer is uniform. But since the electrodes are formed in the surface of the semiconductor substrate 10, contour of the current path passing through the N-type semiconductor layer and near the semiconductor substrate, that is, through a deep portion of the N-type semiconductor layer becomes long. The current path has thus a high resistance and is hard for a current to flow therethrough. In contrast, in the first embodiment, the N-type buried layer 40 having the concentration higher than that of the N-type semiconductor layer 20 is formed below the N-type semiconductor layer 20, and hence the resistance in the deep portion near the semiconductor substrate 10 is low. Thereby the a resistance of a current path passing through the N-type buried layer 40 which is a portion deeper than the N-type semiconductor layer 20 is low, and hence the current indicated by the arrows $Ih_1$ and $Ih_2$ which flows through the N-type semiconductor layer 20 and the N-type buried layer 40 flows uniformly throughout the entirety of the N-type semiconductor layer 20 and the N-type buried layer 40 as illustrated in FIG. 2 without flowing partly along the surface of the N-type semiconductor layer 20.

The current then flows in a direction perpendicular to the semiconductor substrate 10 as indicated by the arrows $Iv_{21}$ and the arrows $Iv_{22}$ toward the surface of the N-type impurity diffusion layer 30 (upward) through the N-type buried layer 40, the N-type semiconductor layer 20, and the N-type impurity diffusion layer 30, to flow into the electrodes 51 and 55.

The magnetic field acts on the currents $Iv_1$, $Iv_{21}$, $Iv_{22}$, $Ih_1$, and $Ih_2$ flowing in this manner, to thereby generate an electromotive force for each of the currents in a direction perpendicular to both the current and the magnetic field. Specifically, a Lorentz force is generated in a direction from the electrode 53 toward the electrode 52 (leftward direction) for the current $Iv_1$, in a direction from the electrode 51 toward the electrode 52 (rightward direction) for the current $Iv_{21}$, in a direction from the electrode 55 toward the P-type electrode isolation diffusion layer 64 (rightward direction) for the current $Iv_{22}$, in a direction from the N-type semiconductor layer 20 and the N-type buried layer 40 toward the electrode 52 (upward direction) for the current $Ih_1$, and in a direction from the N-type semiconductor layer 20 and the N-type buried layer 40 toward the semiconductor substrate 10 (downward direction) for the current $Ih_2$.

In the first embodiment, the currents $Ih_1$ and $Ih_2$ which mainly flow in the directions parallel to the semiconductor substrate 10 and the magnetic field in a direction perpendicular to the currents $Ih_1$ and $Ih_2$ generate particularly large Lorentz forces, generating a difference in potential between the electrode 52 and the electrode 54, which enables the detection of the magnetic field.

In the first embodiment, the flows of the currents $Ih_1$ and $Ih_2$ which flow in the directions parallel to the semiconductor substrate 10 spread throughout the entirety of the N-type semiconductor layer 20 and the N-type buried layer 40 as described above, and can accordingly have a large width in the depth direction. The Hall element's magnetic sensitivity which is in proportion to the width of the flow of current can further be improved according to the first embodiment. As described above, the total thickness of the N-type semiconductor layer 20 and the N-type buried layer 40 is hence preferably as thick as possible.

In the first embodiment, the current flows in the direction parallel to the semiconductor substrate 10 in the N-type semiconductor layer 20 having the low impurity concentration whose mobility 20 is high. Further, since the N-type buried layer 40 having the concentration higher than that of the N-type semiconductor layer 20 but lower than that of the N-type impurity diffusion layer 30, mobility in the N-type buried layer 40 does not reduce so much. Magnetic sensitivity of the Hall element increases also in proportion to the mobility, and hence the magnetic sensitivity can be further increased according to the first embodiment.

Further, since the formation of the N-type buried layer 40 having the concentration higher than that of the N-type semiconductor layer 20 between the N-type semiconductor layer 20 and the semiconductor substrate 10 can suppress leak current at high temperature, it is also possible to obtain the effect that an increase in offset voltage at high temperature can be suppressed.

In this manner, according to the first embodiment, a semiconductor device having a vertical Hall element with high sensitivity and small offset voltage can thus be realized.

Second Embodiment

In the first embodiment described above, since the N-type buried layer 40 having the low resistance is formed below the entire semiconductor layer 20, which means the area of the N-type buried layer 40 is large, there is a possibility that the current consumption may increase. As the second embodiment of the present invention, a description is given of a semiconductor device having a vertical Hall element in which increase in current consumption is suppressed.

Figure 3:
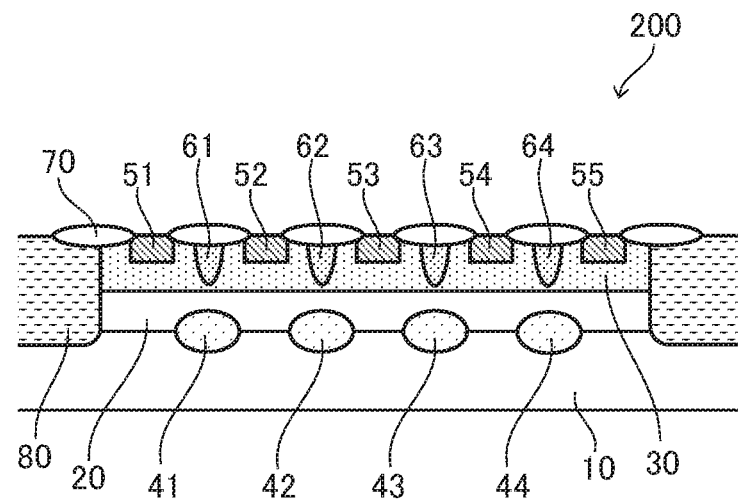
FIG. 3 is a cross-sectional view of a semiconductor device having a vertical Hall element according to a second embodiment of the present invention.

FIG. 3 is a cross-sectional view of a semiconductor device having a vertical Hall element 200 according to the second embodiment of the present invention. The same components as those of the semiconductor device having the vertical Hall element 100 illustrated in FIG. 1B are denoted by the same reference symbols, and a duplicate description is omitted as appropriate.

In the semiconductor device having the vertical Hall element 200 according to the second embodiment, the N-type buried layer 40 in the vertical Hall element 100 according to the first embodiment is eliminated, and instead, N-type buried layers 41 to 44 are formed below the P-type electrode isolation diffusion layers 61 to 64 to isolate the electrodes 51 to 55 from one another, respectively, between the semiconductor substrate 10 and the N-type semiconductor layer 20 and having a concentration higher than that of the N-type semiconductor layer 20.

Here, the N-type buried layers 41 to 44 are arranged substantially immediately below the electrode isolation diffusion layers 61 to 64, respectively, and are separated from one another.

The N-type buried layers 41 to 44 are formed between the semiconductor substrate 10 and the N-type semiconductor layer 20 by, for example, after selectively implanting N-type impurities in regions of the semiconductor substrate 10 in which the N-type buried layers 41 to 44 are formed, forming an epitaxial layer for the N-type semiconductor layer 20 thereon, and diffusing the implanted N-type impurities.

By thus forming the N-type buried layers 41 to 44 only substantially immediately below the electrode isolation diffusion layers 61 to 64 the following effect can be obtained. The resistance of a path of the current flowing from the electrode 53, through the N-type impurity diffusion layer 30 and the N-type semiconductor layer 20, and then through the N-type buried layers 42 and 41 to the electrode 51, and the resistance of a path of current flowing through the N-type buried layers 43 and 44 to the electrode 55 can be prevented from becoming too low, and hence an increase in the current consumption can be suppressed when drive currents are supplied to the electrodes 51, 53, and 55 so that the current flows from the electrode 53 to the electrodes 51 and 55, for example.

Further, immediately below the electrodes 52 and 54, the currents pass through the N-type semiconductor layer 20 having a low impurity concentration, that is, high mobility. Because the magnetic sensitivity of the Hall element is increased in proportion to the mobility, the magnetic sensitivity can be further increased according to the second embodiment.

The N-type buried layers 41 to 44 are preferably not formed immediately below the electrodes 51 to 55. With this configuration, vertical components of current paths, for example, components traveling downward from the electrode 53 in the above-mentioned example do not travel downward completely vertically, but travel toward the N-type buried layers 42 and 43, and hence travel downward in slightly inclined directions. As a result, the slightly inclined vertical components of the current paths become closer in distance to the electrodes 52 and 54 as Hall voltage output electrodes. The Hall voltages obtained from the vertical components of the current paths can hence be increased.

Third Embodiment

As the third embodiment of the present invention, a description is given of a semiconductor device having a vertical Hall element in which an increase in current consumption is suppressed by a configuration different from that in the second embodiment described above.

Figure 4:
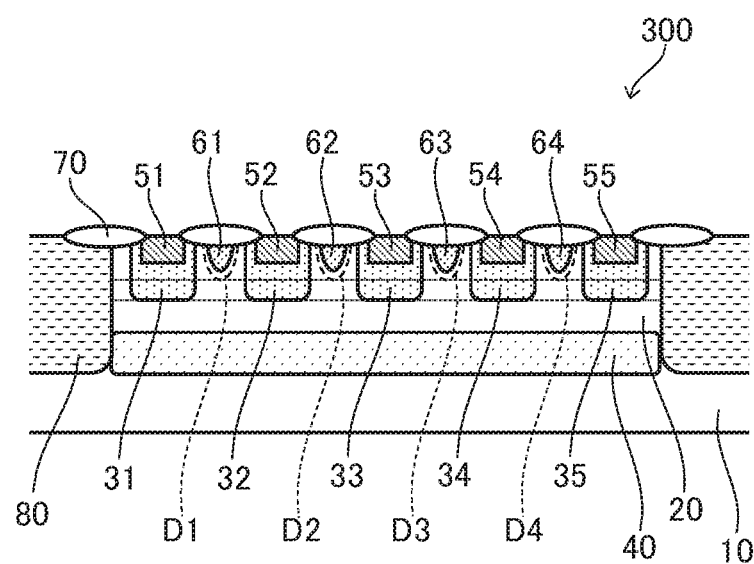
FIG. 4 is a cross-sectional view of a semiconductor device having a vertical Hall element according to a third embodiment of the present invention.

FIG. 4 is a cross-sectional view of a semiconductor device having a vertical Hall element 300 according to the third embodiment of the present invention. The same components as those of the semiconductor device having the vertical Hall element 100 illustrated in FIG. 1B are denoted by the same reference symbols, and a duplicate description is omitted as appropriate.

In the semiconductor device having the vertical Hall element 300 according to the third embodiment, the N-type impurity diffusion layer 30 in the vertical Hall element 100 according to the first embodiment is eliminated, and instead, N-type impurity diffusion layers 31 to 35 are formed around the electrodes 51 to 55, respectively, and are separated from one another. The N-type impurity diffusion layers 31 to 35 are formed deeper than the electrodes 51 to 55 to have the same depth, and to be larger than the electrodes 51 to 55. As with the N-type impurity diffusion layer 30 in the first embodiment, the N-type impurity diffusion layers 31 to 35 each have a concentration distribution which takes the highest in the vicinity of the surface, and decreases as it goes from the surface toward the N-type semiconductor layer 20, and each have a concentration higher than that of the N-type semiconductor layer 20.

The N-type impurity diffusion layers 31 to 35 having the above-mentioned configuration are formed by, for example, after forming the N-type buried layer 40 and the N-type semiconductor layer 20 from an epitaxial layer above the semiconductor substrate 10, selectively implanting N-type impurities in regions of the epitaxial layer in which the N-type impurity diffusion layers 31 to 35 are formed, and diffusing the implanted N-type impurities to a predetermined depth.

Further, in the third embodiment, the P-type electrode isolation diffusion layers 61 to 64 are formed to a depth that is sufficiently shallower than the N-type impurity diffusion layers 31 to 35.

With the above-mentioned configuration, the N-type semiconductor layer 20 having the low impurity concentration is located below the P-type electrode isolation diffusion layers 61 to 64, and a region indicated by the dotted line in FIG. 4 from the bottom of the depletion layers D1 to D4 formed around the P-type electrode isolation diffusion layers 61 to 64 to the bottom of the N-type impurity diffusion layers 31 to 35 also serves as a current path. The current path includes the N-type semiconductor layer 20 having the low impurity concentration, and hence has high resistivity. The current consumption can thus be suppressed. Further, mobility of the current path increases, and hence the magnetic sensitivity can be further increased according to the third embodiment.

It is apparent that the present invention is not limited to the above embodiments and may be modified and changed without departing from the scope and spirit of the invention.

For example, a configuration in which the second embodiment and the third embodiment are combined may be adopted, and the current consumption can be further suppressed thereby.

The first conductivity type and the second conductivity type which are the P-type and the N type, respectively, in the description given above, may be switched to set the first conductivity type as the N type and the second conductivity type as the P-type.

The number of electrodes in the embodiment described above is five. However, at least three electrodes in total, with two electrodes serving as drive current supply electrodes and one electrode serving as a Hall voltage output electrode, are sufficient when the offset voltage can be reduced to a value small enough to render offset cancellation by spinning current unnecessary or is tolerable.

What is claimed is:

1. A semiconductor device, comprising:
   a semiconductor substrate of a first conductivity type; and
   a vertical Hall element formed on the semiconductor substrate,
   the vertical Hall element comprising:
      a semiconductor layer of a second conductivity type provided above the semiconductor substrate;
      an impurity diffusion layer of the second conductivity type formed in an upper portion of the semiconductor layer and having an impurity concentration higher than an impurity concentration of the semiconductor layer;
      a plurality of electrodes formed on a surface of the impurity diffusion layer, arrayed in a straight line, and each formed from an impurity region of the second conductivity type, the impurity region having an impurity concentration higher than the impurity concentration of the impurity diffusion layer;
      a plurality of electrode isolation diffusion layers of the first conductivity type each formed between two adjacent electrodes, to isolate the plurality of electrodes from one another; and
      a buried layer of the second conductivity type formed between the semiconductor substrate and the semiconductor layer, and having an impurity concentration higher than the impurity concentration of the semiconductor layer and lower than the impurity concentration of the impurity diffusion layer.

2. The semiconductor device according to claim 1, wherein the buried layer comprises a plurality of buried layers located substantially immediately below the plurality of electrode isolation diffusion layers, respectively, and each of which is separated from one another.

3. The semiconductor device according to claim 1, wherein the impurity diffusion layer comprises a plurality of impurity diffusion layers formed around the plurality of electrodes, respectively, and each of which is separated from one another.

4. The semiconductor device according to claim 1, wherein each of the plurality of electrode isolation diffusion layers is surrounded by a depletion layer, and lowermost parts of the depletion layers are positioned at substantially the same level as a top surface of the semiconductor layer.

5. The semiconductor device according to claim 1, wherein the impurity diffusion layer has an impurity concentration distribution in which the impurity concentration decreases as a distance from the surface to the semiconductor layer increases.

6. The semiconductor device according to claim 1, wherein the semiconductor layer and the impurity diffusion layer comprise an epitaxial layer.

7. The semiconductor device according to claim 1, wherein the surface of the impurity diffusion layer and surfaces of the plurality of electrode isolation diffusion layers are covered with an insulating film, except for regions in which the plurality of electrodes is formed.

8. The semiconductor device according to claim 1, wherein a number of the plurality of electrodes is at least three.

* * * * *